US012685167B2

(12) United States Patent
Chen et al.

(10) Patent No.: US 12,685,167 B2
(45) Date of Patent: Jul. 14, 2026

(54) HEATSINK FOR RING TYPE INTEGRATED CIRCUITS

(71) Applicant: Cisco Technology, Inc., San Jose, CA (US)

(72) Inventors: Yongguo Chen, Shanghai (CN); Kai Cao, Fremont, CA (US); Hua Yang, Tracy, CA (US); Vic Hong Chia, Sunnyvale, CA (US); Paul Ton, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 578 days.

(21) Appl. No.: 18/169,609

(22) Filed: Feb. 15, 2023

(65) Prior Publication Data

US 2024/0105549 A1 Mar. 28, 2024

Related U.S. Application Data

(60) Provisional application No. 63/377,363, filed on Sep. 28, 2022.

(51) Int. Cl.
*H10W 40/00* (2026.01)
*H10W 40/22* (2026.01)
(Continued)

(52) U.S. Cl.
CPC .... *H10W 40/735* (2026.01); *H10W 72/07355* (2026.01); *H10W 72/351* (2026.01);
(Continued)

(58) Field of Classification Search
CPC ..... H01L 23/4275; H01L 24/08; H01L 24/32; H01L 2224/08111; H01L 2224/32257;

H01L 2224/32501; H01L 2924/1433; H01L 23/34; F28F 3/00–14; H10W 40/735; H10W 72/07355; H10W 72/351;
(Continued)

(56) References Cited

U.S. PATENT DOCUMENTS 9,917,040 B1 3/2018 Rotay
2007/0228530 A1* 10/2007 Sato ...................... H10W 40/70
257/E23.087

(Continued)

FOREIGN PATENT DOCUMENTS

WO 2022192031 A1 9/2022

OTHER PUBLICATIONS

International Search Report and Written Opinion for International Application No. PCT/US2023/075142, mailed Dec. 8, 2023, 15 Pages.

*Primary Examiner* — Zandra V Smith
*Assistant Examiner* — Daniel J Hibbert
(74) *Attorney, Agent, or Firm* — Patterson + Sheridan, LLP

(57) ABSTRACT

The systems and cold plate pedestal and assembly described decrease mechanical stresses in integrated circuits, while also providing efficient thermal coupling between heat producing components and a cold plate. A cold plate assembly includes a cold plate with a pedestal portion a groove formed in a surface of the pedestal portion. The cold plate assembly also includes a thermal pad layer formed in the groove and a phase change material (PCM) layer formed on the surface of the pedestal portion and a surface of the thermal pad layer formed in the groove.

20 Claims, 9 Drawing Sheets

(51) Int. Cl.

| | |
|---|---|
| *H10W 40/73* | (2026.01) |
| *H10W 72/00* | (2026.01) |
| *H10W 72/30* | (2026.01) |
| *H10W 72/90* | (2026.01) |
| *H10W 80/00* | (2026.01) |
| *H10W 90/00* | (2026.01) |

(52) U.S. Cl.
    CPC ...... *H10W 72/9415* (2026.01); *H10W 80/743*
                (2026.01); *H10W 90/736* (2026.01)

(58) Field of Classification Search
    CPC ........... H10W 72/9415; H10W 80/743; H10W
                    90/736; H10W 40/00; H10W 40/22
    See application file for complete search history.

(56) References Cited

U.S. PATENT DOCUMENTS

| | | | |
|---|---|---|---|
| 2008/0017975 A1* | 1/2008 | Deppisch .............. | H10W 40/70 |
| | | | 257/E21.503 |
| 2016/0218086 A1 | 7/2016 | Moda | |
| 2016/0336297 A1 | 11/2016 | Goida et al. | |
| 2017/0022051 A1 | 1/2017 | Xue et al. | |
| 2019/0181073 A1 | 6/2019 | Sakutani | |
| 2019/0373771 A1 | 12/2019 | Yen et al. | |
| 2020/0288604 A1* | 9/2020 | Wong ........................ | G06F 1/20 |
| 2021/0318072 A1 | 10/2021 | Ito et al. | |
| 2021/0328552 A1* | 10/2021 | Tucker ................... | H03F 1/301 |

* cited by examiner

HEATSINK FOR RING TYPE INTEGRATED CIRCUITS

CROSS-REFERENCE TO RELATED APPLICATIONS

This application claims benefit of co-pending U.S. provisional patent application 63/377,363 filed Sep. 28, 2022. The aforementioned related patent application is herein incorporated by reference in its entirety.

TECHNICAL FIELD

Embodiments presented in this disclosure generally relate to cooling arrangements for electronic devices, including integrated circuits (ICs). More specifically, embodiments disclosed herein include grooved cold plate arrangements which decrease a risk of device overheating and structural damage to the electronic devices.

BACKGROUND

As power consumption by ICs, including application-specific integrated circuits (ASICs) and central processing units (CPU), increases due to faster communication and computing requirements, the heat generated by the ASICs/CPUs increases as well. This results in an increased demand for cooling via a heatsink thermally coupled to the ASIC/CPU. The generated heat may be conducted through a limited surface area of the ASIC/CPU to the heatsink via a cold plate attached to the ASIC/CPU. In order to ensure proper cooling in the ASICs/CPUs, different arrangements and heatsink/cold plate architectures have been developed to maximize thermal conductivity.

One example advancement includes the use of a ring type ASIC architecture and cold plate assembly, which provides an increased thermal conductivity compared to previous lid type cold plate/heatsink assemblies for ASICs. However, various challenges remain for ring type ASIC and cold plate assemblies, including a risk of component cracking due to temperature fluctuation.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

One example embodiment includes a cold plate assembly. The cold plate assembly includes a cold plate with a pedestal portion on a first side of the cold plate. The assembly also includes a groove formed in a surface of the pedestal portion and may include a first rounded groove edge. The assembly also includes a thermal pad layer formed in the groove and a phase change material (PCM) layer formed on the surface of the pedestal portion and a surface of the thermal pad layer formed in the groove.

One example embodiment includes a system for cooling a heat source. The system includes a cold plate assembly thermally connected to the heat source. The cold plate assembly may include: a cold plate may having a pedestal portion on a first side of the cold plate, a groove formed in a surface of the pedestal portion with a first rounded groove edge, a thermal pad layer formed in the groove, and a phase change material (PCM) layer formed on the surface of the pedestal portion and a surface of the thermal pad layer formed in the groove.

One example embodiment includes a system for cooling a heat source. The system includes a heatsink disposed remotely from the heat source and a cold plate assembly connected to the heatsink via a plurality of thermal pipes. The cold plate assembly may include: a cold plate with a pedestal portion on a first side of the cold plate; a groove formed in a surface of the pedestal portion having a first rounded groove edge; a thermal pad layer formed in the groove; and a phase change material (PCM) layer formed on the surface of the pedestal portion and a surface of the thermal pad layer formed in the groove.

EXAMPLE EMBODIMENTS

Ring type high-power ASICs packages coupled with a cold plate assembly typically provide more efficient cooling to heat producing components in the overall device package than lid type ASIC architectures. This efficiency is more pronounced in high heat flux packages that may experience large temperature changes during operation. The ring type ASIC package includes a heatsink or cold plate pedestal which is thermally connected directly to a die, while avoiding contact with the structural ring around the die.

In some examples, the die, including a surface of the die, may experience deformation during operation due to increases in temperature. A risk of mechanical stress concentration around a die edge or corner during temperature cycle is increased as the die surface/edge interact with the connected heatsink. This increased mechanical stress may lead to potential cracks or other structural problems in the die.

The cold plate pedestal and groove described herein decreases mechanical stresses in the ASIC while also providing efficient thermal coupling between heat producing components and the cold plate, as described herein in relation to FIGS. 1-5C.

Figure 1:
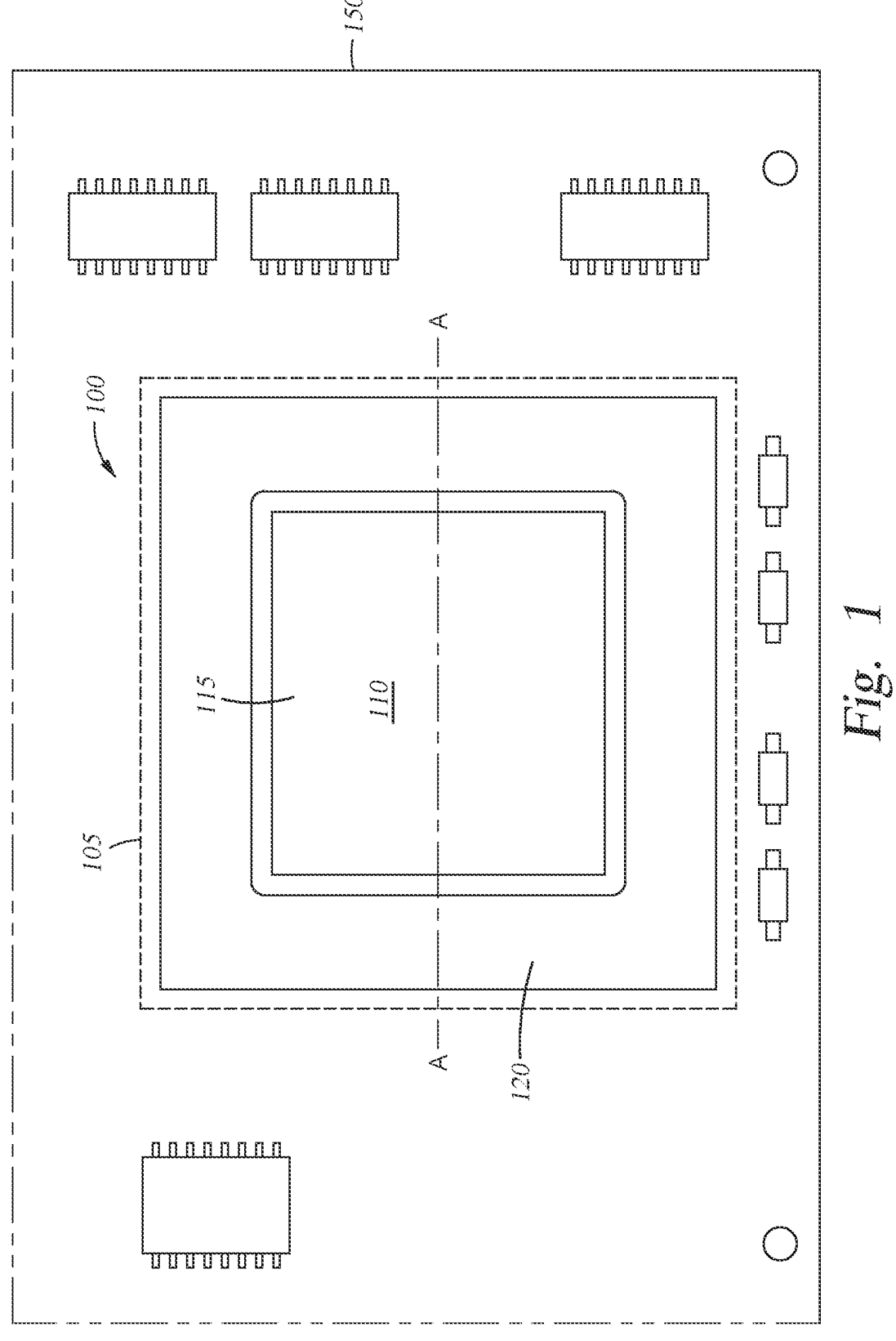
FIG. 1 is a perspective view of a ring type ASIC package, according to an example embodiment.

FIG. 1 is a perspective view of a ring type ASIC package, according to an example embodiment. The arrangement 100 includes a ring type ASIC package 105 without an attached cold plate. While described herein in relation to an ASIC and ASIC assembly, the embodiments described herein may be utilized in any type of IC, electronic device, die, or other device which produces heat. The package 105 includes an ASIC 110 and a ring structure 120. The ring structure 120 and the ASIC 110 are attached to a base structure 150. In some examples, the base structure 150 is a printed circuit board assembly (PCBA) or other similar structure. The PCBA may include other components, devices, ASICs, heatsinks, etc. attached to the PCBA.

While shown in FIG. 1, without an attached cold plate, a cold plate, heatsink, or other cooling system is attached to the package 105 as shown in FIGS. 3, 4A-4C, and FIGS. 5A-5C herein, in order to provide cooling to heat producing components in the package 105. For example, a cold plate thermally coupled to a top surface 115 of the ASIC 110 provides cooling to the ASIC 110. During operation the ASIC 110 is a heat source which produces heat and causes temperature fluctuations across the arrangement 100. In some examples, the temperature fluctuations may also cause deformation or warping in various components including a surface of the ASIC 110 as shown in FIGS. 2A and 2B.

Figures 2A, 2B:
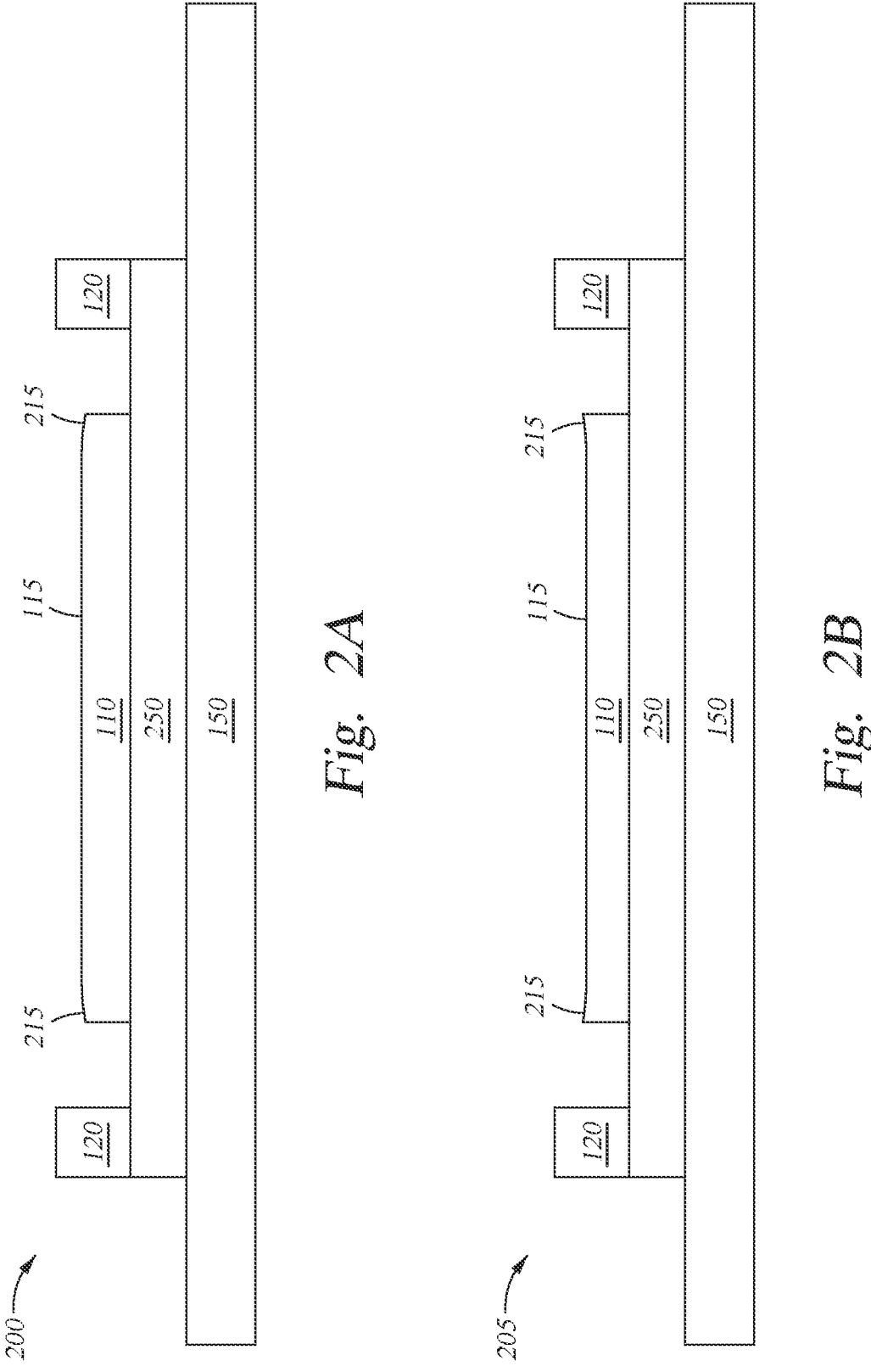
FIGS. 2A and 2B are cross-section views of a ring type ASIC package during temperature changes, according to example embodiments.

FIGS. 2A and 2B are cross-section views of a ring type ASIC package during temperature changes, according to example embodiments. FIG. 2A includes a cross-section view 200 along the axis A-A shown in FIG. 1. In this example, the ASIC 110 and ring structure 120 are mounted on an ASIC substrate 250. The ASIC substrate 250 is attached to the base structure 150. In some examples, the ASIC substrate includes a substrate layer and interconnects, such as solder bumps, (not shown in FIG. 2A) which structural support/attachment between the ASIC 110 and the base structure 150. The substrate layer and interconnects may also provide communication channels for electrical or other signals between the ASIC 110 and the base structure 150.

In the cross-section view 200, the ASIC 110 is at a low temperature such as an ambient temperature (room temperature) or a low operational temperature. At low temperatures, the surface 115, including the edge 215 has a convex shape. In some examples, the surface 115 is warped into the convex shape when mounted to the base structure 150 during assembly of the package 105. While the warped convex shape may have an overall small change in a cross-sectional profile relative to a non-warped surface of the surface 115, edge bending at the edge 215 may be more pronounced. For example, a difference between a non-warped edge and the warped edge 215 may range between 0 to 1.5 mils. As the ASIC 110 performs various operations, the ASIC increases in temperature, which in turn heats the package 105 and causes the surface 115 to change shape as shown in cross-section 205 of FIG. 2B.

In the cross-section 205, the ASIC 110 is at a higher temperature relative to cross-section view 200, such as an operational temperature for the ASIC 110. At high or operational temperatures, the surface 115, including the edge has concave shape. In some examples, the surface 115 warps into the concave shape as the temperature of the package 105 and the surface 115 increases. While the warped concave shape may have an overall small change in a cross-sectional profile relative to a non-warped surface of the surface 115, edge bending at the edge 215 may be more pronounced. For example, a difference between a non-warped edge and the warped edge 215 in the cross-section 205 may also range between 0 to 1.5 mils.

In some examples, the change in the surface 115 between the cross-section views 200 and 205, including the change in the edge bending of the edge 215, does not present a structural challenge to the materials of the ASIC 110 on its own. For example, the material properties of the ASIC 110 may allow for elasticity of the surface 115 and materials of ASIC 110, which allows for fluctuations in the surface 115 without causing mechanical stress in the ASIC 110. However, when the surface 115 interacts with other structures or components, such as a cold plate, the interaction between the warping surface and the other structure may cause stress to build in the structure/materials of the ASIC 110. For example, edge 215 warping into the concave shape shown in cross-section 205 may interact with a cold plate or other non-moving surface, which introduce stress into the structure of the ASIC 110 as the edges 215 cannot warp beyond the non-moving surface. The introduced stress in the ASIC 110 may cause material degradation and cracking in the ASIC 110, which reduces the operational efficiency and expected operational life of the package 105. The cold plate assemblies described in relation to FIGS. 3, 4A-C, and 5A-C provide cold plate assemblies with a groove. The groove eliminates or reduces any potential stress in the ASIC 110 due to warpage of the surface 115.

Figure 3:
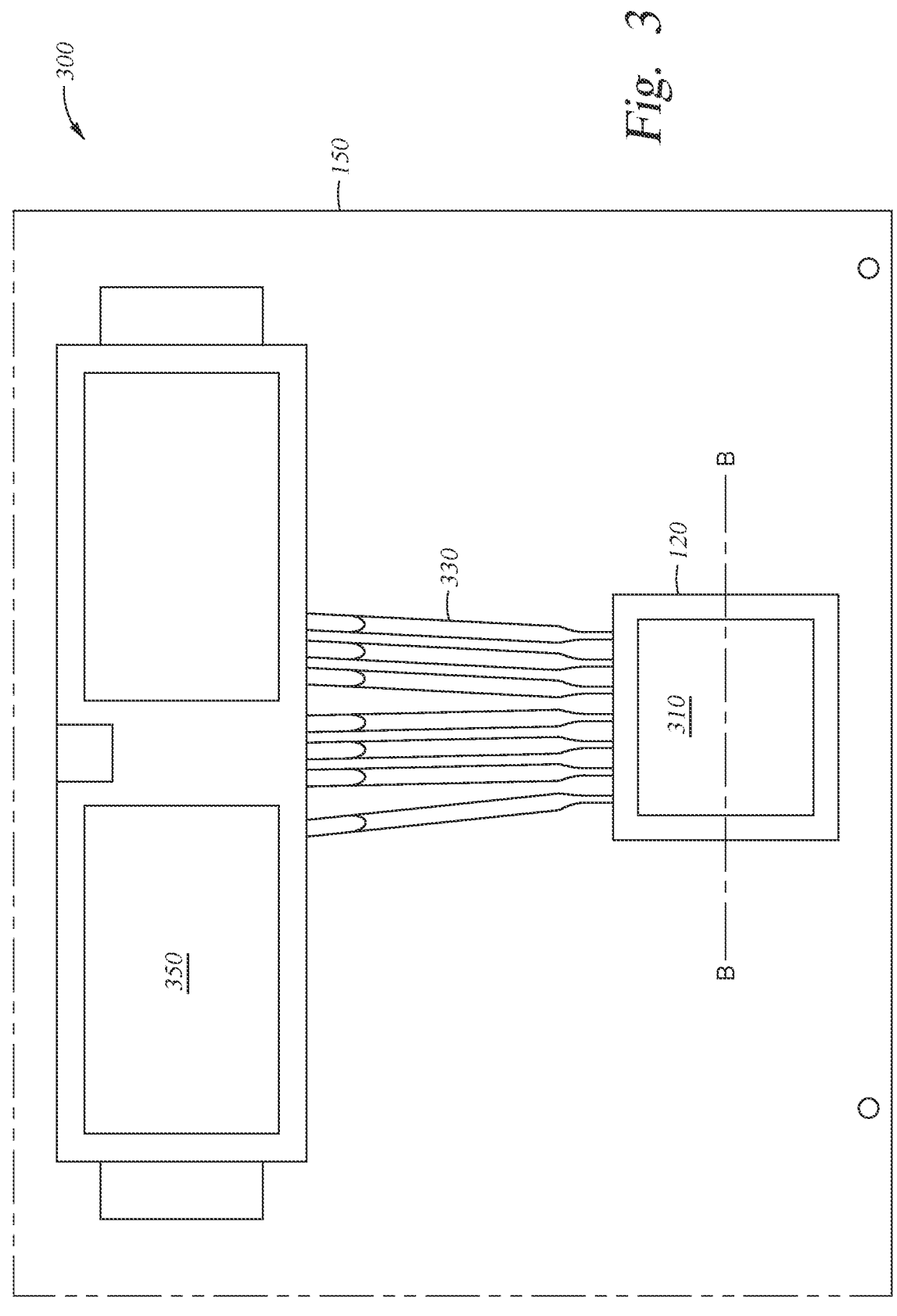
FIG. 3 is a perspective view of a ring type ASIC package with a cold plate and heatsink assembly, according to an example embodiment.

FIG. 3 is a perspective view of a ring type ASIC package with a cold plate and heatsink assembly, according to an example embodiment. Arrangement 300 includes the package 105 shown in FIG. 1 with a cold plate 310 mounted to the package 105 (the view of the package 105 in FIG. 3 is partially obstructed by the cold plate 310. In some examples, the cold plate 310 is an independent cooling system (e.g., provides cooling to the ASIC 110 independently as a heatsink). In another example, the cold plate 310 is a component in a cooling system with a remotely disposed heatsink. For example, the cold plate 310 is connected via thermal pipes 330 to a remote heatsink 350. Heat absorbed from the ASIC 110 into the cold plate 310 is radiated away from the package 105 and the arrangement 300 to prevent overheating of the package 105.

As described above, the cold plate 310 includes a groove which reduces stresses in the ASIC 110 caused by warping of the surface 115, as shown in more detail in relation to FIGS. 4A-4C and FIGS. 5A-5C.

Figure 4A:
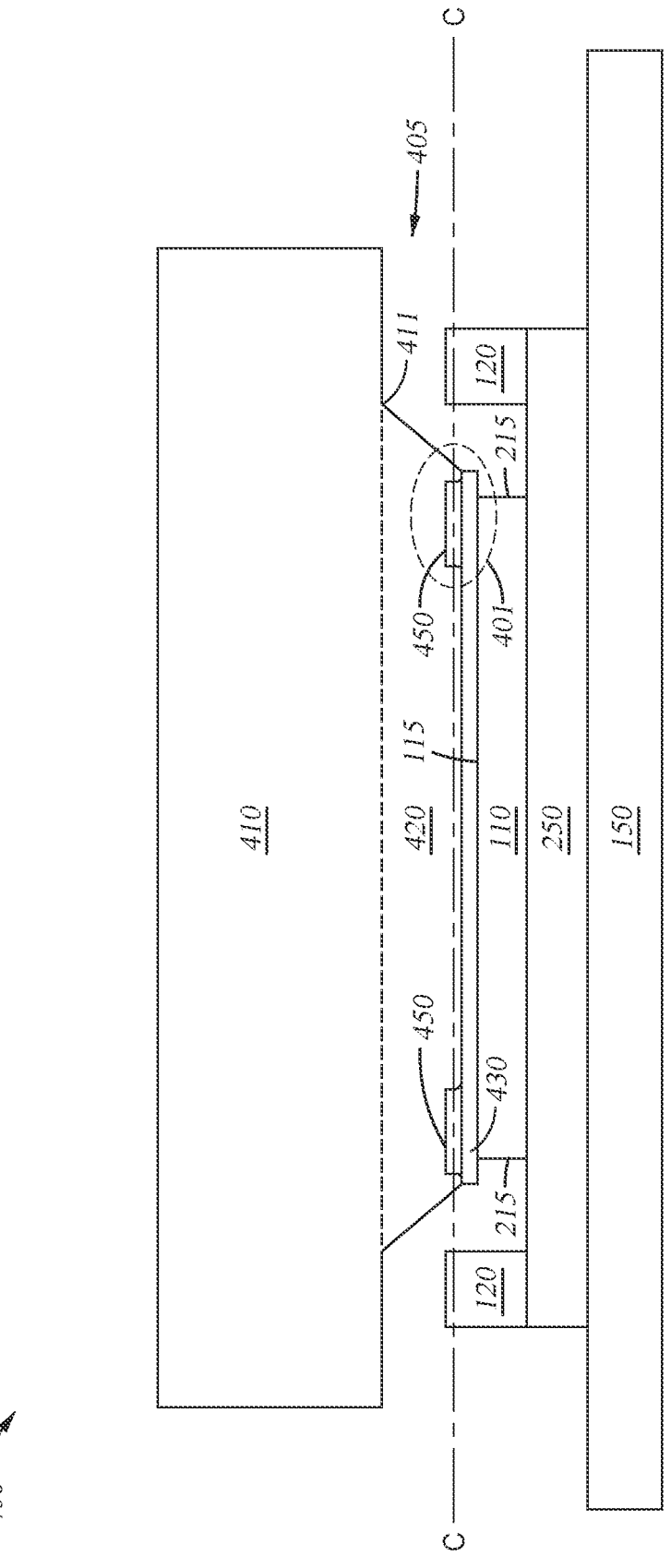
FIGS. 4A-4C are cross-section views of a ring type ASIC package with a cold plate assembly, according to example embodiments.
Figure 4B:
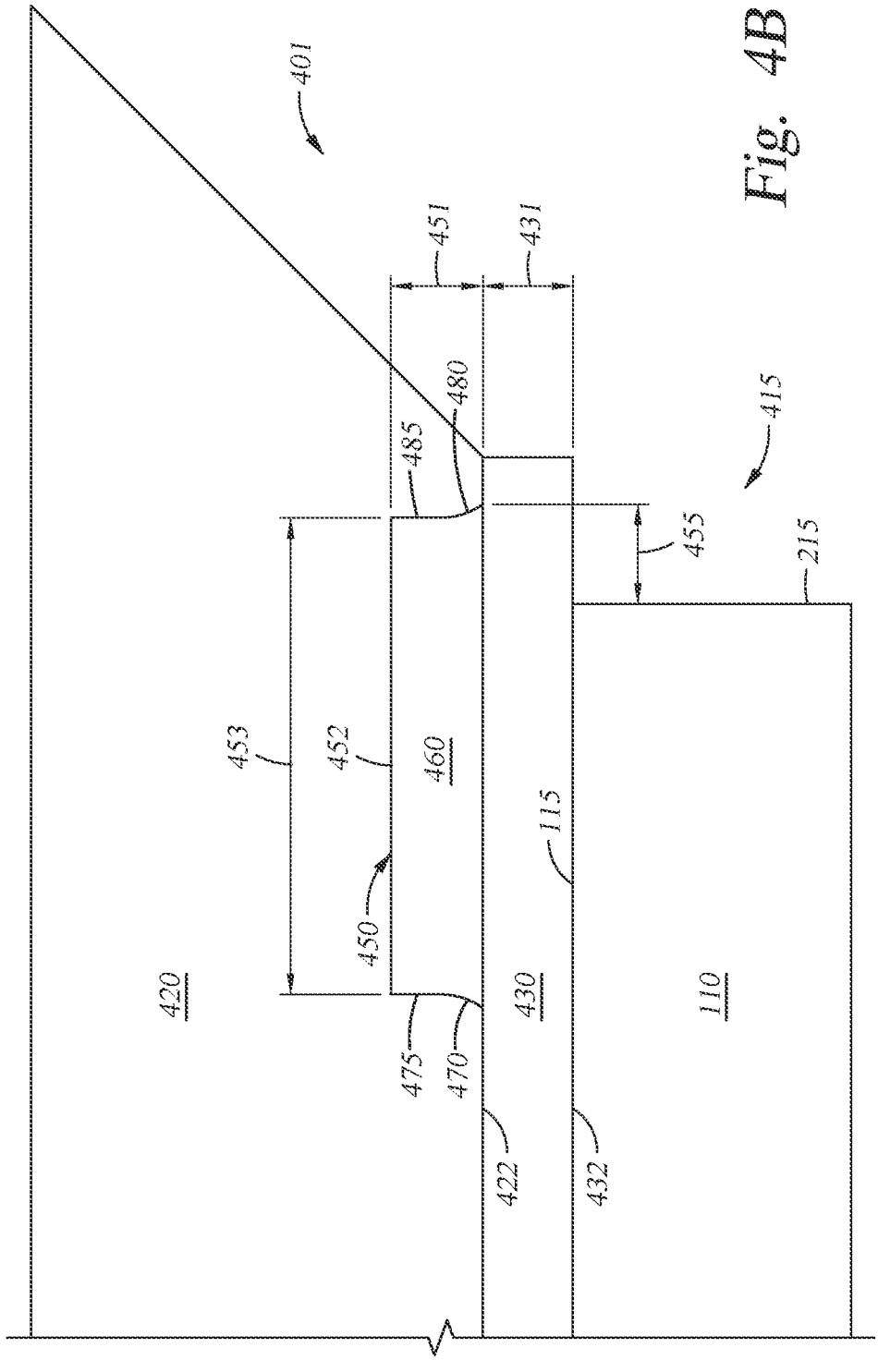
Figure 4C:
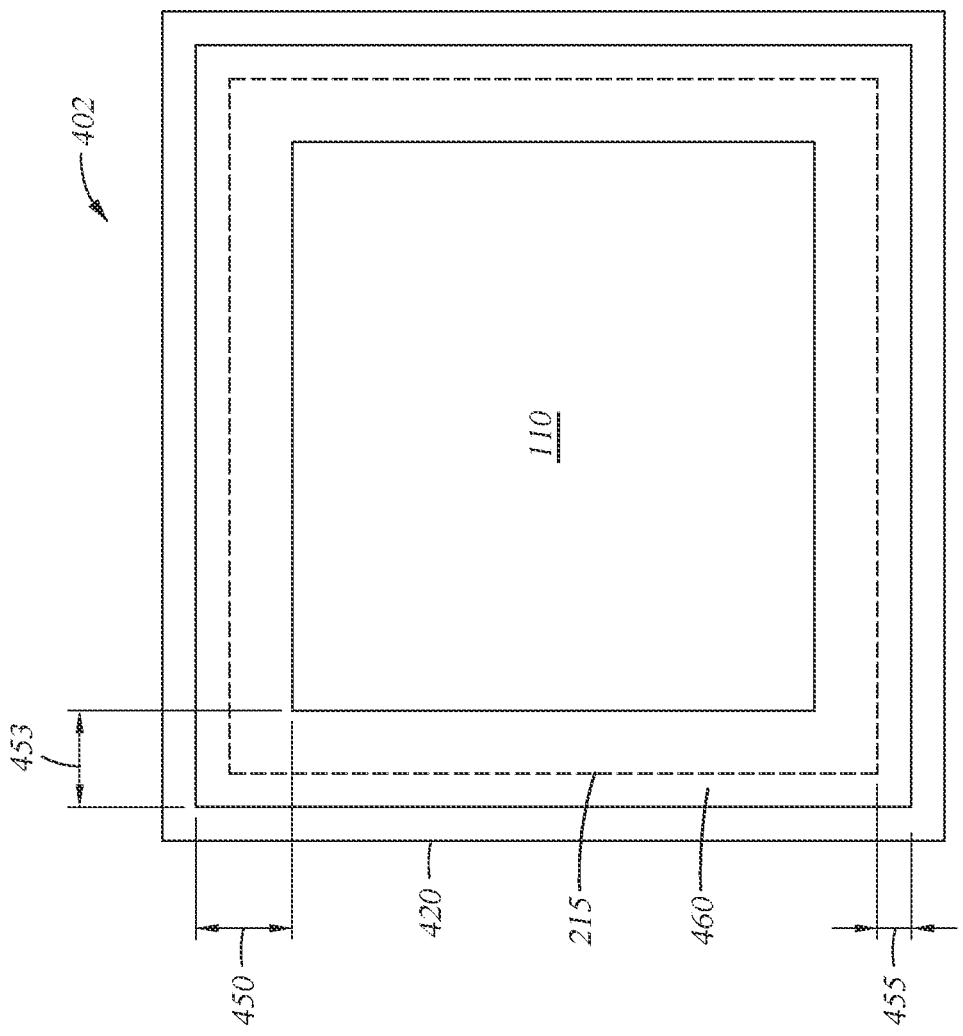

FIGS. 4A, 4B, and 4C are cross-section views of a ring type ASIC package with a cold plate assembly, according to example embodiments. FIG. 4A includes cross-section view 400 of a cold plate assembly 405 of the ASIC with a cold plate and heatsink assembly along the axis B-B shown in FIG. 3. FIG. 4B, is a zoomed cross-section view of the section 401 shown in FIG. 4A. FIG. 4C is a cross-section view 402 along the axis C-C shown in FIG. 4A. For ease of discussion, reference will be made to FIGS. 4A-C during the discussion of the cold plate assembly 405.

In some examples, the cold plate assembly 405 includes a cold plate 410, a cold plate pedestal 420, a groove 450, a thermal pad 460, and a phase change material (PCM) layer 430. The cold plate assembly is attached, mounted, or otherwise thermally connected to the ASIC 110. The ASIC 110 and ring structure 120 are mounted on the ASIC substrate 250, where the ASIC substrate 250 is attached to the base structure 150. In some examples, the cold plate assembly 405 is also attached to the base structure 150.

The cold plate 410 includes a pedestal portion such as the cold plate pedestal 420 positioned or attached on a first side 411 of the cold plate 410. In some examples, the cold plate pedestal 420 and the cold plate 410 are a formed as a single component (e.g., a single piece with the cold plate pedestal 420 formed on the bottom of the cold plate 410). In another example, the cold plate 410 and the cold plate pedestal are separate components that are joined together at the first side 411.

In order to prevent material stress or cracking in the ASIC 110 during operation at high heats, the cold plate pedestal 420 includes the groove 450 formed in a surface 422 as shown in FIG. 4B. The groove 450 includes thermal pad layer, such as the thermal pad 460.

In some examples, the thermal pad 460 is formed in the groove 450 to fill the groove. The thermal pad 460 serves as a physical and thermal buffer between edge 215 of the ASIC 110 and cold plate pedestal 420. For example, the thermal pad 460 absorbs any corner/edge deformation, such as the warping shown in FIG. 2B, which prevents crack and other stress potential in the ASIC 110. The thermal pad may include a thermal interface layer (TIM) with a thermal conductivity of at least 10 Watts per meter-Kelvin to provide thermal conductivity through the groove 450.

In the cold plate assembly 405, the groove 450 includes two rounded edges such as rounded edge 470 and rounded edge 480. In some examples, the rounded edge 470 and rounded edge 480 are an additional mechanism to prevent stress concentration in the in the ASIC 110. For example, as the edge 215 warps upward into the groove 450 and thermal pad 460, the rounded edges 470 and 480 prevent stress concentration that may be caused by a sharp groove edge.

The groove is formed by a recessed surface 452 which is recessed from the surface 422 of the cold plate pedestal 420. In some examples, the groove 450 is formed in the surface 422 using standard machining processes to etch or machine away material of the cold plate pedestal 420 to a recess depth 451 between the surface 422 and the recessed surface 452 as shown in FIG. 4B. The recess depth 451 may include a depth of approximately 0.2 millimeters (mm) to provide space for edge bending from the edge 215 as the ASIC 110 increases in temperature.

In some examples, the groove 450 includes a first sidewall 475 between the recessed surface 452 and the surface 422. The groove 450 of the cold plate assembly 405 also includes a second sidewall 485 between the recessed surface 452 and the surface 422. The rounded groove edge 470 is formed at the intersection of the surface 422 and the first sidewall 475. The rounded groove edge 480 is formed at the intersection of the surface 422 and the second sidewall 485. The groove 450 and the recessed surface 452 have a width 453 as shown in FIGS. 4B and 4C. The width 453 may measure between 3 to 4 mm.

The cold plate assembly 405 also includes the PCM layer 430 formed on the surface 422. In some examples, the PCM is a thermal interface material, and any suitable PCM material may be used in the PCM layer 430. In some examples, the PCM layer 430 is solid at a temperature of 45° Celsuis (C) or lower and a liquid at 45° C. or higher. These physical properties of the PCM layer 430 provide low thermal resistance between the cold plate 410 and the ASIC 110. In some examples, the PCM layer 430 is formed or deposited on the surface 422 prior to attaching or joining the cold plate assembly 405 to the package 105. The PCM layer 430 may be formed on the surface 422 and over the thermal pad 460 and groove 450 at thickness 431 of approximately 0.25 mm. The PCM layer 430 includes a bottom side 432 opposite the surface 422 of the cold plate pedestal 420.

The cold plate assembly is attached to the ASIC 110 to provide thermal coupling and cooling to the ASIC 110 via the PCM layer 430 and the cold plate pedestal 420. For example, the side 432 is attached or otherwise joined to the surface 115 of the ASIC 110. In some examples, the cold plate assembly 405 is positioned relative to the ASIC 110 in order to align the groove 450 to the edge 215. In some examples, the groove 450 and the edge 215 are aligned to provide for edge bending of the top surface of the ASIC 110 without causing mechanical stress or cracking in the ASIC 110.

In one example, the cold plate assembly 405 is attached to the ASIC 110 or positioned relative to the ASIC 110 where approximately 70% of the width 453 is in a facing relationship with the surface of the ASIC 110 on a first side of the side edge of the ASIC 110 and 30% of the width, such as width 455 shown in FIGS. 4B and 4C, of the recessed surface 452 is positioned in a facing relationship with an open space 415 beside the edge 215 (shown in FIG. 4B).

With reference to FIG. 4C, the cross-section view 402 includes the groove 450, a semitransparent view of the thermal pad 460, and a transparent view of the PCM layer 430 (i.e. the PCM layer 430 is not illustrated in FIG. 4C). As shown in the cross-section view 402, the groove 450 may form a complete circuit or ring shape corresponding to the entire edge 215 of the ASIC 110. In the cold plate assembly 405, a majority of the surface 115 of the ASIC 110 is thermally connected directly to the cold plate pedestal 420 (via the PCM layer 430), where the relatively small width of the groove 450 does not degrade a thermal performance of the cold plate assembly 405. Additionally, the recess depth 451 is a relatively shallow depth such that the use of the thermal pad 460 to provide thermal connectivity to the edge 215 does not degrade the thermal performance of the cold plate assembly 405. In the cold plate assembly 405, the groove 450 is formed in the surface 422 such that the groove includes two sidewalls; however, the groove may also be formed as an open groove shown in FIGS. 5A-C.

Figure 5A:
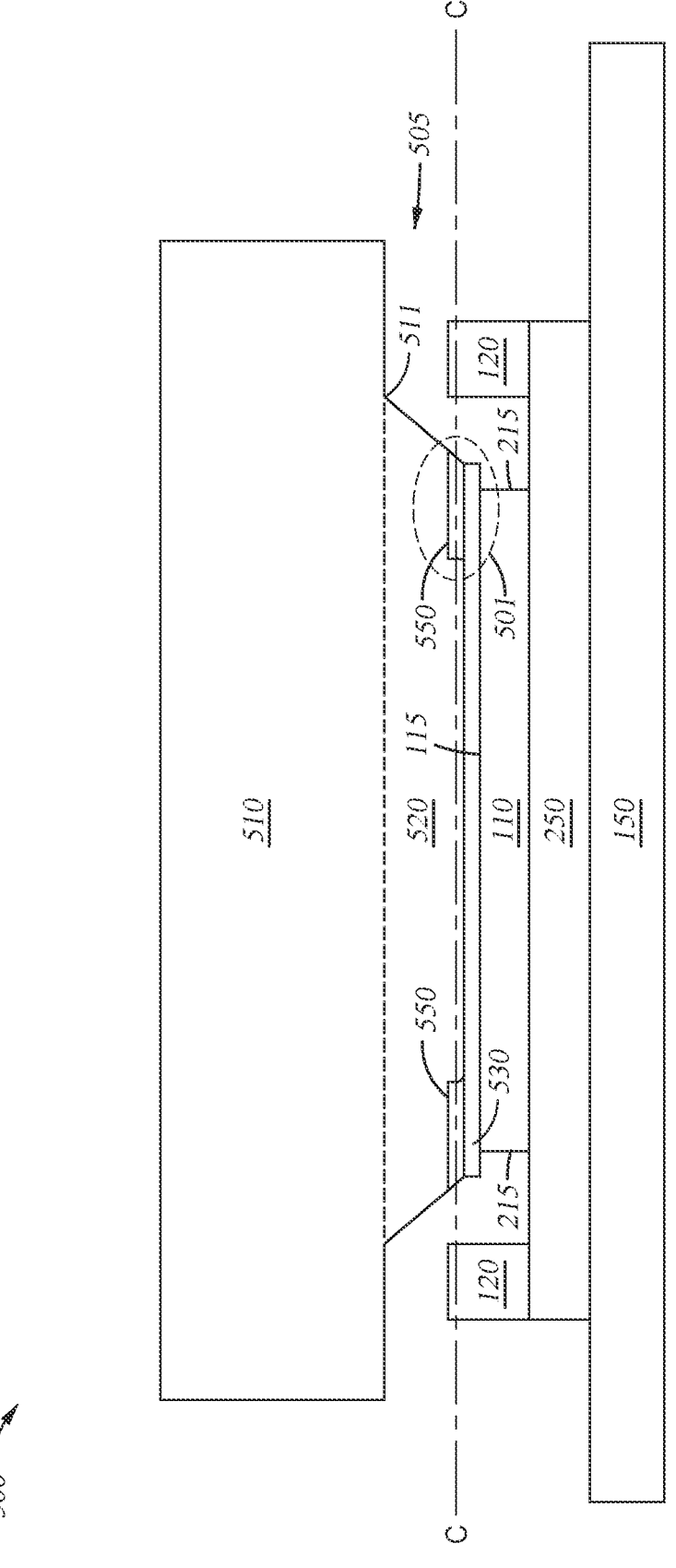
FIGS. 5A-5C are cross-section views of a ring type ASIC package with a cold plate assembly, according to example embodiments.
Figure 5B:
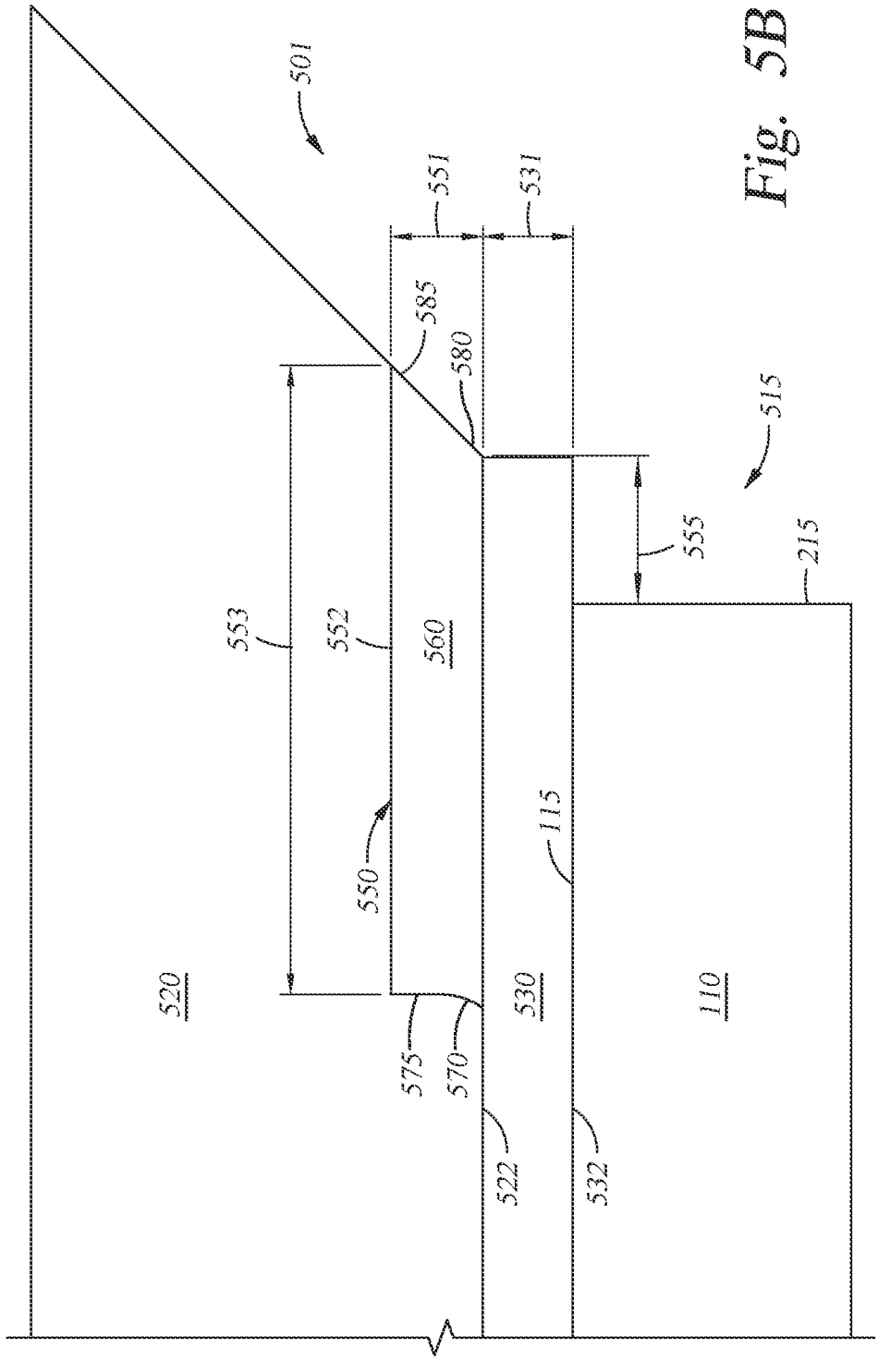
Figure 5C:
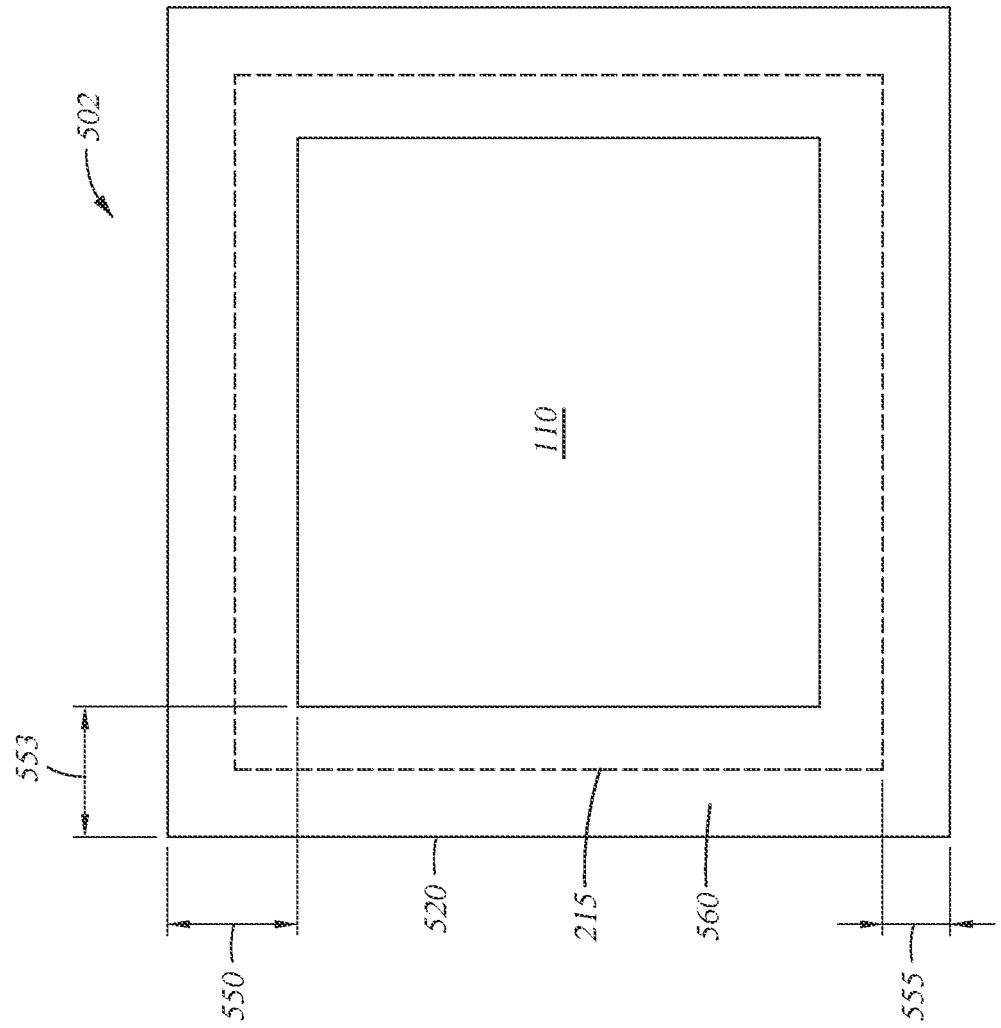

FIGS. 5A, 5B, and 5C are cross-section views of a ring type ASIC package with a cold plate assembly, according to example embodiments. FIG. 5A includes cross-section view 500 of a cold plate assembly 505 of the ASIC with a cold plate and heatsink assembly along the axis B-B shown in FIG. 3. FIG. 5B, is a zoomed cross-section view of the section 501 shown in FIG. 5A. FIG. 5C is a cross-section view 502 along the axis C-C shown in FIG. 5A. For ease of discussion, reference will be made to FIGS. 5A-C during the discussion of the cold plate assembly 505.

In some examples, the cold plate assembly 505 includes an example cold plate assembly which includes a cold plate 510, a cold plate pedestal 520, a groove 550, a thermal pad 560, and a PCM layer 530. The cold plate assembly is attached, mounted, or otherwise thermally connected to the ASIC 110. The ASIC 110 and ring structure 120 are mounted on the ASIC substrate 250, where the ASIC substrate 250 is attached to the base structure 150.

In some examples, the cold plate 510 includes a pedestal portion such as the cold plate pedestal 520 positioned or attached on a first side 511 of the cold plate 510. In some examples, the cold plate pedestal 520 and the cold plate 510 are a formed as a single component (e.g., a single piece with the cold plate pedestal 520 formed on the bottom of the cold plate 510). In another example, the cold plate 510 and the cold plate pedestal are separate components that are joined together at the first side 511.

In order to prevent material stress or cracking in the ASIC 110 during operation at high heats, the cold plate pedestal 520 includes the groove 550 formed in a surface 522 as shown in FIG. 5B. The groove 550 includes thermal pad layer, such as the thermal pad 560.

In some examples, the thermal pad 560 is formed in the groove 550 to fill the groove. The thermal pad serves as a physical and thermal buffer between the edges 215 of the ASIC 110 and the cold plate pedestal 520. For example, the thermal pad 560 absorbs any corner/edge deformation of the edge 215, such as the warping shown in FIG. 2B, which prevents crack and other stress potential in the ASIC 110. The thermal pad 560 may include a TIM with a thermal conductivity of at least 10 Watts per meter-Kelvin to provide thermal conductivity through the groove 550.

In the cold plate assembly 505, the groove 550 includes a rounded groove edge 570 and an open side 580. The groove 550 is formed by a recessed surface 552 which is recessed from the surface 522 of the cold plate pedestal 520. In some examples, the groove 550 is formed in the surface 522 using standard machining processes to etch or machine away material of the cold plate pedestal 520 to a recess depth 551 between the surface 522 and the recessed surface 552 as shown in FIG. 5B. The recess depth 551 may include a depth of approximately 0.2 millimeters (mm) to provide space for edge bending from the edge 215 as the ASIC 110 increases in temperature.

In some examples, the groove 550 includes a first sidewall 575 between the recessed surface 552 and the surface 522. The open side 580 is opposite the first sidewall 575 across the groove 550. In this example, the recessed surface 552 extends in a first direction from the first sidewall 575 to a recessed outer sidewall 585 of the cold plate pedestal 520. The rounded groove edge 570 is formed at the intersection of the surface 522 and the first sidewall 575. The groove 550 and the recessed surface 552 have a width 553 as shown in FIGS. 5B and 5C. The width 553 may measure between 3 to 4 mm.

The cold plate assembly 505 also includes the PCM layer 530 formed on the surface 522. In some examples, the PCM layer 530 is formed or deposited on the surface 522 prior to attaching or joining the cold plate assembly 505 to the package 105. The PCM layer 530 may be formed on the surface 522 and over the thermal pad 560 and groove 550 at thickness 531 of approximately 0.25 mm. The PCM layer 530 includes a bottom side 532 opposite the surface 522 of the cold plate pedestal 520.

The cold plate assembly is attached to the ASIC 110 to provide thermal coupling and cooling to the ASIC 110 via the PCM layer 530 and the cold plate pedestal 520. For example, the side 532 is attached or otherwise joined to the surface 115 of the ASIC 110. In some examples, the cold plate assembly 505 is positioned relative to the ASIC 110 in order to align the groove 550 to the edge 215. In some examples, the groove 550 and the edge 215 are aligned to provide for edge bending of the top surface of the ASIC 110 without causing mechanical stress or cracking in the ASIC 110.

In one example, the cold plate assembly 505 is attached to the ASIC 110 or positioned relative to the ASIC 110~70% of the width 553 is in a facing relationship with the surface of the ASIC 110 on a first side of the side edge of the ASIC 110 and 30% of the width, such as width 555 shown in FIGS. 5B and 5C, of the recessed surface 552 is positioned in a facing relationship with an open space 515 beside the edge 215 (shown in FIG. 5B).

With reference to FIG. 5C, the cross-section view 502 includes the groove 550, a semitransparent view of the thermal pad 560, and a transparent view of the PCM layer 530 (i.e. the PCM layer 530 is not illustrated in FIG. 5C). As shown in the cross-section view 502, the groove 550 may form a complete circuit shape or ring shape corresponding to the entire edge 215 of the ASIC 110. In the cold plate assembly 505, a majority of the surface 115 of the ASIC 110 is directly thermally connected to the cold plate pedestal 520, where the relatively small width of the groove 550 does not degrade a thermal performance of the cold plate assembly 505. Additionally, the recess depth 551 is a relatively shallow depth such that the use of the thermal pad 560 to provide thermal connectivity to the edge 215 does not degrade the thermal performance of the cold plate assembly 505. In the cold plate assembly 505, the groove 550 is formed in the surface 522 such that the groove includes two sidewalls; however, the groove may also be formed as an open groove shown in FIGS. 5A-C.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," or "at least one of A or B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

The block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. A cold plate assembly comprising:

a cold plate comprising a pedestal portion on a first side of the cold plate;

a groove formed in a surface of the pedestal portion comprising a first rounded groove edge;

a thermal pad layer formed in the groove, wherein the thermal pad layer in the groove is disposed between a phase change material (PCM) layer and the surface of the pedestal portion forming the groove; and the PCM layer formed on the surface of the pedestal portion and a surface of the thermal pad layer formed in the groove.

2. The cold plate assembly of claim 1, wherein the groove comprises:

a recessed surface recessed from the surface of the pedestal portion; and a first sidewall between the recessed surface and the surface of the pedestal portion, wherein the first rounded groove edge is formed at an intersection of the surface of the pedestal portion and the first sidewall.

3. The cold plate assembly of claim 2, wherein a recess depth between the surface of the pedestal portion and the recessed surface comprises 0.2 millimeters.

4. The cold plate assembly of claim 2, wherein the groove further comprises:

an open side opposite the first sidewall, wherein the recessed surface extends in a first direction from the first sidewall to a recessed outer sidewall of the pedestal portion.

5. The cold plate assembly of claim 2, wherein the groove further comprises:

a second sidewall between the recessed surface and the surface of the pedestal portion; and a second rounded groove edge formed at an intersection of the second sidewall and the surface of the pedestal portion.

6. The cold plate assembly of claim 2, wherein a width of the recessed surface comprises a measurement between 3 to 4 millimeters.

7. The cold plate assembly of claim 6, wherein the cold plate assembly is attached to an integrated circuit (IC), wherein a surface of the PCM layer opposite the surface of the pedestal portion is attached to a surface of the IC, wherein the surface of the IC comprises a side edge, wherein the cold plate assembly is attached to the IC such that 70% of the width of the recessed surface is in a facing relationship with the surface of the IC on a first side of the side edge of the IC, and wherein 30% of the width the recessed surface is positioned in a facing relationship with an open space on a second side of the side edge of the IC.

8. The cold plate assembly of claim 1, wherein the thermal pad layer comprises a thermal interface layer (TIM) comprising a thermal conductivity of at least 10 Watts per meter-Kelvin.

9. The cold plate assembly of claim 1, wherein the PCM layer comprises a thickness of 0.25 millimeters.

10. A system for cooling a heat source, comprising:

cold plate assembly thermally connected to the heat source, the cold plate assembly comprising:

a cold plate comprising a pedestal portion on a first side of the cold plate;

a groove formed in a surface of the pedestal portion comprising a first rounded groove edge;

a thermal pad layer formed in the groove, wherein the thermal pad layer in the groove is disposed between a phase change material (PCM) layer and the surface of the pedestal portion forming the groove; and the PCM layer formed on the surface of the pedestal portion and a surface of the thermal pad layer formed in the groove.

11. The system of claim 10, wherein the groove comprises:

a recessed surface recessed from the surface of the pedestal portion; and a first sidewall between the recessed surface and the surface of the pedestal portion, wherein the first rounded groove edge is formed at an intersection of the surface of the pedestal portion and the first sidewall.

12. The system of claim 11, wherein the groove further comprises:

an open side opposite the first sidewall, wherein the recessed surface extends in a first direction from the first sidewall to a recessed outer sidewall of the pedestal portion.

13. The system of claim 11, wherein the groove further comprises:

a second sidewall between the recessed surface and the surface of the pedestal portion; and a second rounded groove edge formed at an intersection of the second sidewall and the surface of the pedestal portion.

14. The system of claim 11, wherein a width of the recessed surface comprises a measurement between 3 to 4 millimeters, wherein the heat source is an integrated circuit (IC), wherein a surface of the PCM layer opposite the surface of the pedestal portion is attached to a surface of the IC, wherein the surface of the IC comprises a side edge, wherein the cold plate assembly is attached to the IC such that 70% of the width of the recessed surface is in a facing relationship with the surface of the IC on a first side of the side edge of the IC, and wherein 30% of the width the recessed surface is positioned in a facing relationship with an open space on a second side of the side edge of the IC.

15. A system for cooling a heat source, comprising:

a heatsink disposed remotely from the heat source;

a cold plate assembly connected to the heatsink via a plurality of thermal pipes, wherein the cold plate assembly comprises:

a cold plate comprising a pedestal portion on a first side of the cold plate;

a groove formed in a surface of the pedestal portion comprising a first rounded groove edge;

a thermal pad layer formed in the groove, wherein the thermal pad layer in the groove is disposed between a phase change material (PCM) layer and the surface of the pedestal portion forming the groove; and the PCM layer formed on the surface of the pedestal portion and a surface of the thermal pad layer formed in the groove.

16. The system of claim 15, wherein the groove comprises:

a recessed surface recessed from the surface of the pedestal portion; and a first sidewall between the recessed surface and the surface of the pedestal portion, wherein the first rounded groove edge is formed at an intersection of the surface of the pedestal portion and the first sidewall.

17. The system of claim 16, wherein the groove further comprises:

an open side opposite the first sidewall, wherein the recessed surface extends in a first direction from the first sidewall to a recessed outer sidewall of the pedestal portion.

18. The system of claim 16, wherein the groove further comprises:

a second sidewall between the recessed surface and the surface of the pedestal portion; and a second rounded groove edge formed at an intersection of the second sidewall and the surface of the pedestal portion.

19. The system of claim 16, wherein a width of the recessed surface comprises a measurement between 3 to 4 millimeters, wherein the heat source is an integrated circuit (IC), wherein a surface of the PCM layer opposite the surface of the pedestal portion is attached to a surface of the IC, wherein the surface of the IC comprises a side edge, wherein the cold plate assembly is attached to the IC such that 70% of the width of the recessed surface is in a facing relationship with the surface of the IC on a first side of the side edge of the IC, and wherein 30% of the width the recessed surface is positioned in a facing relationship with an open space on a second side of the side edge of the IC.

20. The system of claim 15, wherein the thermal pad layer comprises a thermal interface layer (TIM) comprising a thermal conductivity of at least 10 Watts per meter-Kelvin.

* * * * *